(12) United States Patent
Kirchmeier

(10) Patent No.: US 7,692,389 B2
(45) Date of Patent: Apr. 6, 2010

(54) METHOD AND DEVICE FOR LOAD MATCHING

(75) Inventor: Thomas Kirchmeier, Teningen (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 189 days.

(21) Appl. No.: 11/670,637

(22) Filed: Feb. 2, 2007

(65) Prior Publication Data

US 2007/0194628 A1 Aug. 23, 2007

(30) Foreign Application Priority Data

Feb. 4, 2006 (DE) .................. 10 2006 005 128

(51) Int. Cl.
*H05B 31/26* (2006.01)
(52) U.S. Cl. ................... 315/111.21; 315/111.51; 315/111.71; 156/345.44
(58) Field of Classification Search ............ 315/111.01, 315/111.21, 326, 111.51, 111.71; 219/121.41, 219/121.43; 118/723 I; 156/345.38, 345.47, 156/345.44, 45.47
See application file for complete search history.

(56) References Cited

U.S. PATENT DOCUMENTS

| | | | | |
|---|---|---|---|---|
| 4,890,073 A | * | 12/1989 | Flachenecker et al. | ......... 331/55 |
| 5,135,628 A | * | 8/1992 | Allington | .................... 204/458 |
| 5,272,417 A | | 12/1993 | Ohmi | |
| 5,288,971 A | | 2/1994 | Knipp | |
| 5,543,689 A | * | 8/1996 | Ohta et al. | ............. 315/111.21 |
| 5,556,549 A | * | 9/1996 | Patrick et al. | .................. 216/61 |
| 5,793,162 A | * | 8/1998 | Barnes et al. | ........... 315/111.21 |
| 5,982,099 A | | 11/1999 | Barnes et al. | |
| 6,136,388 A | | 10/2000 | Raoux et al. | |
| 6,358,573 B1 | | 3/2002 | Raoux et al. | |
| 6,537,421 B2 | | 3/2003 | Drewery | |
| 6,631,693 B2 | | 10/2003 | Hilliker | |
| 6,706,138 B2 | | 3/2004 | Barnes et al. | |
| 6,795,796 B2 | | 9/2004 | Nakano et al. | |
| 6,815,899 B2 | | 11/2004 | Choi | |
| 6,822,396 B2 | | 11/2004 | Gonzalez et al. | |
| 7,326,872 B2 | * | 2/2008 | Shannon | ................. 219/121.41 |
| 2002/0134508 A1 | * | 9/2002 | Himori et al. | .......... 156/345.44 |
| 2003/0041972 A1 | | 3/2003 | Hirose | |
| 2003/0151372 A1 | * | 8/2003 | Tsuchiya et al. | ........ 315/111.81 |
| 2005/0061442 A1 | * | 3/2005 | Higashiura | ............. 156/345.44 |
| 2006/0005928 A1 | * | 1/2006 | Howald et al. | ......... 156/345.48 |

FOREIGN PATENT DOCUMENTS

| | | |
|---|---|---|
| DE | 19717127 | 10/1998 |
| JP | 2005-500684 | 1/2005 |
| WO | 2005119734 | 12/2005 |

OTHER PUBLICATIONS

Translation of Japanese Office Action from corresponding Japanese Application No. 2007-24521, mailed May 27, 2009, 9 pages.

* cited by examiner

*Primary Examiner*—David Hung Vu
*Assistant Examiner*—Tung X Le
(74) *Attorney, Agent, or Firm*—Fish & Richardson P.C.

(57) ABSTRACT

The impedance of a variable load is matched to the output resistance of an HF generator by performing a first impedance matching for a first load impedance and by performing a second impedance matching for a second load impedance. The first impedance matching is carried out at a first frequency and the second impedance matching is carried out at a second frequency.

27 Claims, 1 Drawing Sheet

METHOD AND DEVICE FOR LOAD MATCHING

CROSS REFERENCE TO RELATED APPLICATION

This application claims priority under 35 U.S.C §119(a) to German Patent Application 10 2006 005 128.9-54, filed Feb. 4, 2006, the entire contents of which are hereby incorporated by reference.

TECHNICAL FIELD

The invention relates to a method and a device for matching the impedance of a variable load to the output resistance of a high frequency (HF) generator or source.

BACKGROUND

A load impedance, such as, for example, a plasma impedance, can be influenced by many parameters and therefore can vary over time. Thus, it can be difficult to match such a variable load impedance to an HF source. Automatic tuning circuits are sometimes used to improve matching of the load impedance in plasma thin-film technology for surface treatments. The automatic tuning circuits continuously follow changes in the load impedance in the plasma process.

Load impedances of laser excitation plasmas tend to fluctuate less than load impedances for plasma thin-film technologies Thus, fix match circuits can be used for load impedances of laser excitation plasmas. These fix match circuits are fixedly set for an acceptable load matching under standard burning (or ignited) conditions.

If the HF power from the source is supplied in a pulsed mode and the power is regulated by influencing the pulse duty factor, the load impedance fluctuation problem can be exacerbated since a periodic change between the impedance during the burning state and the impedance during ignition of the plasma also exists in the switched-on state.

Consequently, a compromise between optimization of the load matching and the ignition behavior is frequently set as matching. In addition, an ignition auxiliary circuit is usually used.

SUMMARY

In one general aspect, the impedance of a variable load is matched to the output resistance of an HF generator by performing a first impedance matching for a first load impedance at a first frequency and performing a second impedance matching for a second load impedance at a second frequency. In this way, it is possible to automatically select between the two matchings according to the load impedance. That is, if a first load is present, a first impedance matching is performed on the first load, without any reactive elements in the matching circuit needing to be changed, and if a second load is present, a second impedance matching is performed with the same matching circuit, without needing to change any reactive elements. In particular, no separate triggering elements (such as, for example, variable elements or switching element) are required to change between the two matchings. Moreover, power that is output by an HF generator at a frequency higher than the fundamental frequency can be used in this way to ignite a plasma. An additional ignition aid is not needed.

Impedance matching can be carried out using a fixedly-set, non-variable matching device that is designed for two different load impedances at two different frequencies. The matching device uses two fixed, non-variable matchings, and does not require variable elements that are adjusted according to varying load impedance to produce matching. In this way, a matching for a high-impedance load impedance and a matching for a low-impedance load impedance can be provided.

The first frequency and the second frequency can be selected from the frequency spectrum of the HF generator. For example, the first frequency can be the fundamental frequency of the HF generator and the second frequency can be a harmonic. The power delivered at the fundamental frequency can be used for the ignited plasma operation (that is, the state in which the plasma is burning) and the power delivered at a harmonic can be used to ignite the plasma, and an optimal matching is provided in both cases by the fixed impedance matching. The matching device design can benefit from the fact that a plasma is easier to ignite with increasing frequency. For example, the industry frequency 13.56 MHz can be used as the fundamental frequency and the second harmonic at 40.68 MHz can be used as the harmonic.

The impedance matching can be carried out by means of a matching device whose structure is determined as follows. A first matching network is determined for a first impedance matching of a first load impedance at a first frequency. A second matching network is determined for a second impedance matching of a second load impedance at a second frequency. A minimal structure (that is, a basic circuit) containing at least both matching networks is determined, and the individual components of the minimal structure are replaced by LC arrangements that represent the respectively desired inductance or capacitance values for both frequencies. The LC arrangements can include series components, parallel components, or both series and parallel components.

The first and second load impedances can be predefined. A circuit that implements this method can be designed particularly simply. For the particular application of plasma processes, the first load impedance can be selected in the range of the impedance of an ignited plasma and the second load impedance can be selected in the range of the impedance of an unignited discharge section (that is, the gap between the electrodes in the plasma chamber).

Another aspect of the invention features a matching device that matches the impedance of a variable load to the output resistance of an HF generator. The matching device is designed for impedance matching of the first load impedance at a first frequency and for impedance matching of the second load impedance at a second frequency. The first matching or the second is selected automatically depending on the load impedance. Therefore, the matching device need not include separate switches or adjustment of components.

The first frequency can be the fundamental frequency of the HF generator and the second frequency can be a harmonic of the fundamental frequency. In this case, use can be made of the fact that the output circuit of HF generators frequently has a low Q factor so that this has a low spectral purity. The fundamental frequency and one or more harmonics are thus also provided by the HF generator. In plasma operation, the substantial power of the HF generator is drawn from the fundamental frequency. However, the power associated with a harmonic is frequently sufficient to ignite a plasma. In the case of impedance matching to a high impedance (for example, the impedance of an unignited discharge section) at a frequency that is higher than the fundamental frequency, the required ignition power can be delivered with good matching into a plasma chamber or to the electrodes of the plasma chamber.

The matching device can be fixedly set for matching a first and a second load impedance. Such a matching device provides good matching of a plasma load and also good matching during ignition of a plasma without there being any need for switches to enable variable load matching or variable capacitors that need to be driven by a controller and/or moved by motors. Furthermore, the matching device need not include ignition aids. The matching device can thus be implemented particularly cost-effectively.

In some implementations, the matching device can be designed with no variable elements nor switching elements.

The matching device can be embodied as a series and/or parallel circuit of a plurality of passive components, in particular, inductors and/or capacitors, whose matching behavior is different for two predefined frequencies. Compared to a conventional fix match matching that is only designed for one load at one frequency, individual reactance components are replaced by series or parallel combinations that represent different L (inductance) or C (capacitance) values depending on the frequency. As a result, additional degrees of freedom are provided, making it possible to design the matching device taking into account the overall matching in such a manner that matching can be improved or optimized at two different frequencies for two different impedances.

In another general aspect, a plasma process excitation arrangement includes an HF generator, a load, and an interposed matching device as described above. For some embodiments, the plasma process excitation arrangement provides impedance matching and ease of ignition of a plasma load.

The plasma process excitation arrangement can be designed for pulsed power supply with a duty factor adjustable by a power regulator. During such power regulation by means of the duty factor, oscillation of the output circuit builds up or decays rapidly so that steep flanks of the power signal are formed. This is achieved by a low Q factor of the output circuit, for example, a Q factor Q<3. A low-Q circuit can be implemented particularly cost-effectively and has a low spectral purity, and therefore such a low-Q circuit can be used for the matching device.

Further features and advantages are obtained from the following description with reference to the figures in the drawings, which show details, and from the claims. The features mentioned above and below can be utilized individually or collectively in arbitrary combination. The embodiments shown and described are not to be understood as exhaustive enumeration but have exemplary character for describing the invention

DETAILED DESCRIPTION

Figure 1:
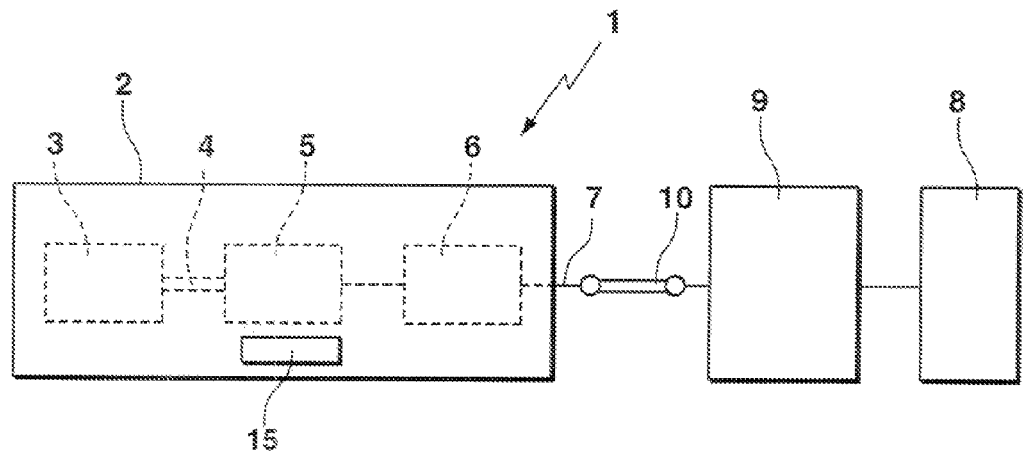
FIG. 1 is a schematic diagram of a plasma process excitation arrangement that includes a matching device.

FIG. 1 shows a plasma process excitation arrangement 1 having an HF generator 2. The HF generator 2 includes a driver stage 3 that is connected through a cable 4 to a tube end stage 5. The tube end stage 5 is connected to an output circuit 6 through which an HF power is delivered to an output 7. The output 7 can be a 50Ω output; in this case, the HF generator 2 would have an output resistance of 50Ω. The HF power generated at the output 7 by the HF generator 2 is to be delivered to a load 8 having a variable load impedance. For example, the load 8 can be an ignited (that is, a burning) low-impedance plasma or an unignited high-impedance discharge section (that is, a gap or a conduction region between the two electrodes in the plasma chamber). In order to obtain improved or optimal matching to the output 7 for both states of the load 8, a matching device 9 is interposed between the load 8 and the output 7 and is connected to the output 7 by way of a cable 10. The matching device 9 is designed in such a manner that at a low impedance, the load 8 is matched to the output 7 and thus to the output resistance of the HF generator 2 at a frequency of the HF generator 2, and at a high impedance, the load 8 is matched to the output resistance of the HF generator 2 at a second frequency of the HF generator 2.

The HF generator 2 is designed for pulsed power supply to the load 8. The power delivered is adjusted by adjusting the pulse duty factor using a power regulator 15 within the HF generator 2. In order to ensure steep flanks (that is, an output signal from the HF generator 2 that has a steep slope), the output circuit 6 has a low Q factor (for example, a Q<3). As a result, the output circuit 6 can be constructed cost-effectively and simply. As a result of the low Q factor, however, the output circuit 6 has a low spectral purity so that power is also output at harmonics of the fundamental frequency, that is, at integer multiples of the fundamental frequency. The output power at frequencies above the fundamental frequency is lower than the output power at the fundamental frequency. If a discharge section is not ignited, however, the power output at a higher frequency is sufficient to ignite the plasma. In this case, the matching device 9 matches the load 8 to the output 7. Thus, no additional ignition aid is required. As soon as the plasma is ignited, the load impedance of the load 8 drops to a low value. In this case, the matching device 9 performs a matching to the output 7 since matching now takes place for the power output at the fundamental frequency. The matching for different load impedances thus takes place solely in dependence on the frequency and automatically and with only the use of passive components such as inductors and capacitors. Moreover, variable elements (such as variable capacitors) or switching elements are not required in the matching device 9.

Figure 2A:
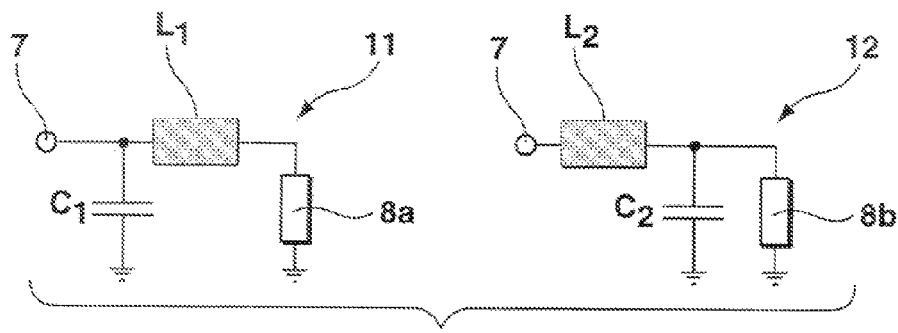
FIGS. 2a and 2b illustrate the steps for determining the design of the matching device of FIG. 1.

The configuration of the matching device 9 can be determined, as explained below and with reference to FIGS. 2a-2c. First, a first matching network 11 is determined for impedance matching of a first (high-impedance) load impedance 8a to the output 7 at a first frequency. In this embodiment, the matching network 11 includes components $L_1$ (a first inductor) and $C_1$ (a first capacitor). Second, a second matching network 12 is determined for impedance matching of a second (low-impedance) load impedance 8b to the output 7 at a second frequency. In this embodiment, the matching network 12 includes components $L_2$ (a second inductor) and $C_2$ (a second capacitor).

Figure 2B:
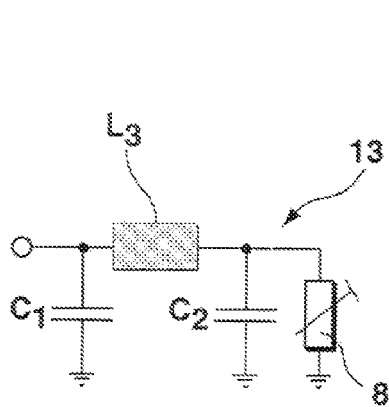
Figure 2C:
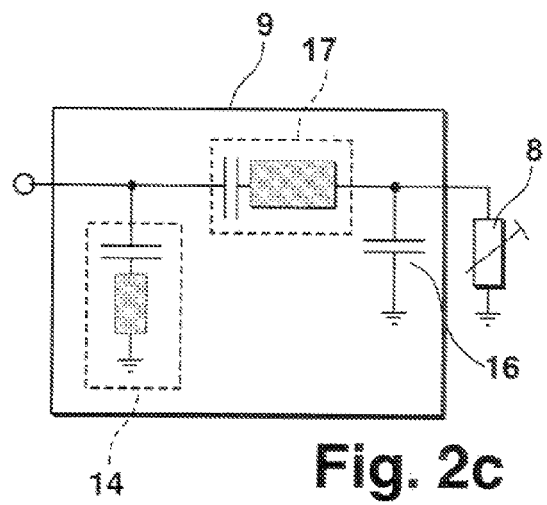
FIG. 2c is a schematic diagram of the matching device of FIG. 1.

A minimal structure 13 (that is, a basic circuit) including a least both matching networks 11, 12 is then determined (as shown in FIG. 2b). In this embodiment, the inductors $L_1$, $L_2$ are combined to form the inductor $L_3$.

The individual components C1, C2 and L3 are replaced by LC arrangements that have the respectively desired L (inductance) or C (capacitance) value for both frequencies. Thus, in this embodiment, a series LC arrangement 14 replaces the capacitor $C_1$, a series LC arrangement 17 replaces the inductor $L_3$ and a capacitor 16 replaces the capacitor $C_2$. The arrangements 14, 17, 16 together form the matching device 9, which is designed for load impedance matching of the two load impedances 8*a*, 8*b* two different frequencies.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of matching an impedance of a variable load to an output resistance of a high-frequency electrical generator generating two frequencies, the method comprising:
    matching a first impedance of the variable load to the output resistance of the generator output at a first frequency of the generator with a matching device; and
    matching a second impedance of the variable load to the output resistance of the generator output at a second frequency of the generator, different from the first frequency, wherein both the first and second frequencies are based on a fundamental frequency of the generator.

2. The method of claim 1, wherein the matching device is a non-variable matching device, and wherein matching the first and second impedance of the variable load at the first and second frequencies includes interconnecting the non-variable matching device between the generator output and the variable load, the non-variable matching device configured such that at a low impedance, the variable load is matched to the output resistance of the generator output at the first frequency, and at a high impedance, the variable load is matched to the output resistance of the generator output at the second frequency.

3. The method of claim 1, wherein the first and second frequencies are selected from a frequency spectrum of the generator.

4. The method of claim 1, wherein the first frequency is the fundamental frequency of the generator and the second frequency is a harmonic of the fundamental frequency of the generator.

5. The method of claim 1, wherein matching the variable load impedance at the first and second frequencies includes determining a structure of the matching device.

6. The method of claim 5, wherein determining the structure of the matching device comprises:
    determining a first matching network for matching the impedance of the variable load to the output resistance of the generator output at the first frequency;
    determining a second matching network for matching the impedance of the variable load to the output resistance of the generator output at the second frequency;
    determining a basic circuit including the first and second matching networks; and
    replacing components of the basic circuit with LC arrangements that represent respectively desired inductance or capacitance values for the first and second frequencies.

7. The method of claim 6, wherein the LC arrangements includes components that are in series, in parallel, or in both series and parallel configurations.

8. The method of claim 1, wherein the first and second impedances are predefined.

9. The method of claim 1, further comprising selecting the first impedance of the variable load to be within a range of impedance values for ignited plasma.

10. The method of claim 1, further comprising selecting the second impedance of the variable load to be within a range of impedance values for an unignited discharge gap.

11. The method of claim 1, wherein matching the first impedance of the variable load to the output resistance of the generator output at the first frequency with the matching device is performed only if the generator operates at the first frequency.

12. The method of claim 1, wherein matching the second impedance of the variable load to the output resistance of the generator output at the second frequency with the matching device is performed only if the generator operates at the second frequency.

13. The method of claim 1, wherein the matching device includes reactive elements and wherein matching the impedance of the variable load at the first and second frequencies includes matching the impedance of the variable load at the first and second frequencies with only the use of the reactive elements in the matching device.

14. A matching device for matching the impedance of a variable load to the output resistance of a high frequency electrical generator generating two frequencies, wherein the matching device is designed to match the impedance of the variable load to the output resistance of the generator at a first and second frequency of the generator, wherein the second frequency is distinct from the first frequency, and wherein both the first and second frequencies are based on a fundamental frequency of the generator.

15. The matching device of claim 14, wherein the first frequency is the fundamental frequency of the generator and the second frequency is a harmonic of the fundamental frequency.

16. The matching device of claim 14, wherein the matching device is fixedly set for matching the variable load impedance at the first and second frequencies.

17. The matching device of claim 14, wherein the matching device is free of variable and switching elements.

18. The matching device of claim 14, comprising a circuit of exclusively passive components whose matching behavior is different for two predefined frequencies.

19. The matching device of claim 18, wherein the passive components include inductors and/or capacitors.

20. A plasma processing system comprising:
    an electrical generator generating predefined and distinct first and second frequencies that are both based on a fundamental frequency of the generator,
    a plasma processing device forming a variable load, and
    a matching device interconnecting an output of the generator and the load, the matching device comprising exclusively passive components whose matching behavior is different for the first and second frequencies of the generator.

21. The plasma processing system of claim 20, wherein the generator is configured to function as a pulsed power supply with a duty factor adjustable by a power regulator.

22. The plasma processing system of claim 20, wherein the generator has an output circuit with a Q factor of less than 3.

23. The plasma processing system of claim 20, wherein the output of the generator is connected to the matching device by a discrete cable.

24. The plasma processing system of claim 20, wherein the matching device matches a variable load impedance to an output resistance of the generator output at the first frequency and at the second frequency.

25. The plasma processing system of claim 24, wherein the matching device automatically matches the variable load impedance to the output resistance of the generator output at the first frequency and automatically matches the variable load impedance to the output resistance of the generator output at the second frequency.

26. The plasma processing system of claim 20, wherein the matching device includes LC arrangements that represent respectively desired inductance or capacitance values for each of the different predefined frequencies.

27. A method of matching an impedance of a variable load to an output resistance of a high-frequency electrical generator output, the method comprising:

matching a first impedance of the variable load to the output resistance of the generator output at a first frequency with a matching device; and matching a second impedance of the variable load to the output resistance of the generator output at a second frequency, different from the first frequency, wherein both the first and second frequencies are based on a fundamental frequency of the generator, wherein the matching device is a non-variable matching device, and wherein matching the first and second impedance of the variable load at the first and second frequencies includes interconnecting the non-variable matching device between the generator output and the variable load, the non-variable matching device configured such that at a low impedance, the variable load is matched to the output resistance of the generator output at the first frequency, and at a high impedance, the variable load is matched to the output resistance of the generator output at the second frequency.

* * * * *